US008751687B2

(12) United States Patent
Nagy et al.

(10) Patent No.: US 8,751,687 B2
(45) Date of Patent: Jun. 10, 2014

(54) EFFICIENT ENCODING OF STRUCTURED DATA

(75) Inventors: Alexander F. Nagy, Seattle, WA (US); Ashok Chandrasekaran, Redmond, WA (US); Kristof Roomp, Mira-sol (ES); Novia Rosalinda Wijaya, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 565 days.

(21) Appl. No.: 12/771,924

(22) Filed: Apr. 30, 2010

(65) Prior Publication Data
US 2011/0271011 A1 Nov. 3, 2011

(51) Int. Cl.
*G06F 15/16* (2006.01)

(52) U.S. Cl.
USPC ........ 709/246; 455/466; 455/412.1; 707/693; 707/714; 707/745; 340/50; 340/52; 340/55; 340/87

(58) Field of Classification Search
None
See application file for complete search history.

(56) References Cited

U.S. PATENT DOCUMENTS

| | | | | |
|---|---|---|---|---|
| 5,678,043 A * | 10/1997 | Ng et al. | | 707/693 |
| 5,878,033 A * | 3/1999 | Mouly | | 370/312 |
| 5,974,180 A * | 10/1999 | Schwendeman | | 382/232 |
| 6,249,614 B1 | 6/2001 | Kolesnik et al. | | |
| 6,539,369 B2 | 3/2003 | Brown | | |
| 6,601,071 B1 * | 7/2003 | Bowker et al. | | 715/234 |
| 7,010,605 B1 | 3/2006 | Dharmarajan | | |
| 7,446,678 B2 * | 11/2008 | Karmakar et al. | | 341/50 |
| 7,557,738 B2 * | 7/2009 | Hunt | | 341/55 |
| 7,769,904 B2 * | 8/2010 | Eller | | 709/250 |
| 7,827,315 B2 * | 11/2010 | Kirkland | | 709/247 |
| 7,885,988 B2 * | 2/2011 | Bashyam et al. | | 707/812 |
| 7,886,203 B2 * | 2/2011 | Goswami et al. | | 714/702 |
| 7,895,347 B2 * | 2/2011 | Schneider | | 709/230 |
| 8,044,828 B2 * | 10/2011 | Karmakar et al. | | 341/50 |
| 8,099,115 B2 * | 1/2012 | Clegg | | 455/466 |
| 8,102,402 B2 * | 1/2012 | Sorgard et al. | | 345/582 |
| 8,108,361 B2 * | 1/2012 | Netz et al. | | 707/687 |
| 2004/0073710 A1 * | 4/2004 | Fallon | | 709/247 |
| 2005/0188054 A1 * | 8/2005 | Riihijarvi et al. | | 709/218 |
| 2006/0205420 A1 * | 9/2006 | Bibr et al. | | 455/466 |
| 2007/0041447 A1 | 2/2007 | Burazerovic et al. | | |
| 2008/0085728 A1 * | 4/2008 | Reding et al. | | 455/466 |
| 2008/0090597 A1 * | 4/2008 | Celik et al. | | 455/466 |
| 2008/0162497 A1 * | 7/2008 | Lim | | 707/10 |

(Continued)

FOREIGN PATENT DOCUMENTS

WO 2005112270 A1 11/2005

OTHER PUBLICATIONS

"Compatibility Methods for Video Coding Systems", Retrieved at <<http://wftp3.itu.int/av-arch/avc-site/1990-1996/H310_H323_Experts_Group/Contributions/AVC-0032.pdf>>, May 23-24, 1991, pp. 1-5.

(Continued)

*Primary Examiner* — Greg C Bengzon
(74) *Attorney, Agent, or Firm* — Sung Kim; Andrew Sanders; Micky Minhas

(57) ABSTRACT

This document describes various techniques for efficiently sequencing structured data in a particular order to provide a sequence of data elements suitable for storage or communication. The sequence may contain values representing a number of default-value structured data elements omitted from the sequence and/or a byte length of the sequence.

20 Claims, 6 Drawing Sheets

(56) References Cited

U.S. PATENT DOCUMENTS

| | | |
|---|---|---|
| 2009/0070157 A1* | 3/2009 | Weitman .......................... 705/5 |
| 2009/0075681 A1* | 3/2009 | Jager ............................ 455/466 |
| 2009/0169120 A1 | 7/2009 | Otani |
| 2010/0106692 A1* | 4/2010 | Moloney ....................... 707/693 |
| 2010/0131476 A1* | 5/2010 | Kataoka et al. ............... 707/693 |

OTHER PUBLICATIONS

Vermorel, Joannes., "Cloud Computing, Machine Learning and Startups", Retrieved at <<http://vermorel.com/journal/2009/12/3/serialization-in-the-cloud-sharedcontract-vs-sharedtype.html>>, Dec. 3, 2009, pp. 12.

* cited by examiner

EFFICIENT ENCODING OF STRUCTURED DATA

BACKGROUND

Encoding allows structured data to be transmitted or written to a storage medium. During the encoding process, information is added to the structured data allowing encoded data received or read from a storage medium to be decoded and re-structured. The additional information, which represents encoding overhead, can increase time, bandwidth, and storage costs associated with communicating and/or storing structured data.

SUMMARY

This document describes various techniques for efficiently sequencing structured data in a particular order to provide a sequence of data elements suitable for storage or communication. The sequence may contain values representing a number of default-value structured data elements omitted from the sequence and/or a byte length of the sequence. These values represent substantially reduced overhead compared to the overhead of many conventional encoding techniques.

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit of a reference number identifies the figure in which the reference number first appears. The use of the same reference number in different instances in the description and the figures may indicate similar or identical items.

DETAILED DESCRIPTION

Overview

This document describes various techniques for efficiently sequencing structured data in a particular order to provide a sequence of data elements suitable for storage or communication. The sequence may contain values representing a number of default-value structured data elements omitted from the sequence, values representing a number of structured data elements present in the sequence, and optionally a byte length of the sequence. In some embodiments a sequence of data elements may be transmitted through a network or written to storage media. In other embodiments, a received sequence of data elements may be structured to provide structured data suitable for processing. Various embodiments of these techniques result in sequences having fewer data elements and/or less encoding overhead, which reduce time, bandwidth, and costs associated with communicating and/or storing the sequences.

Example Environment

Figure 1:
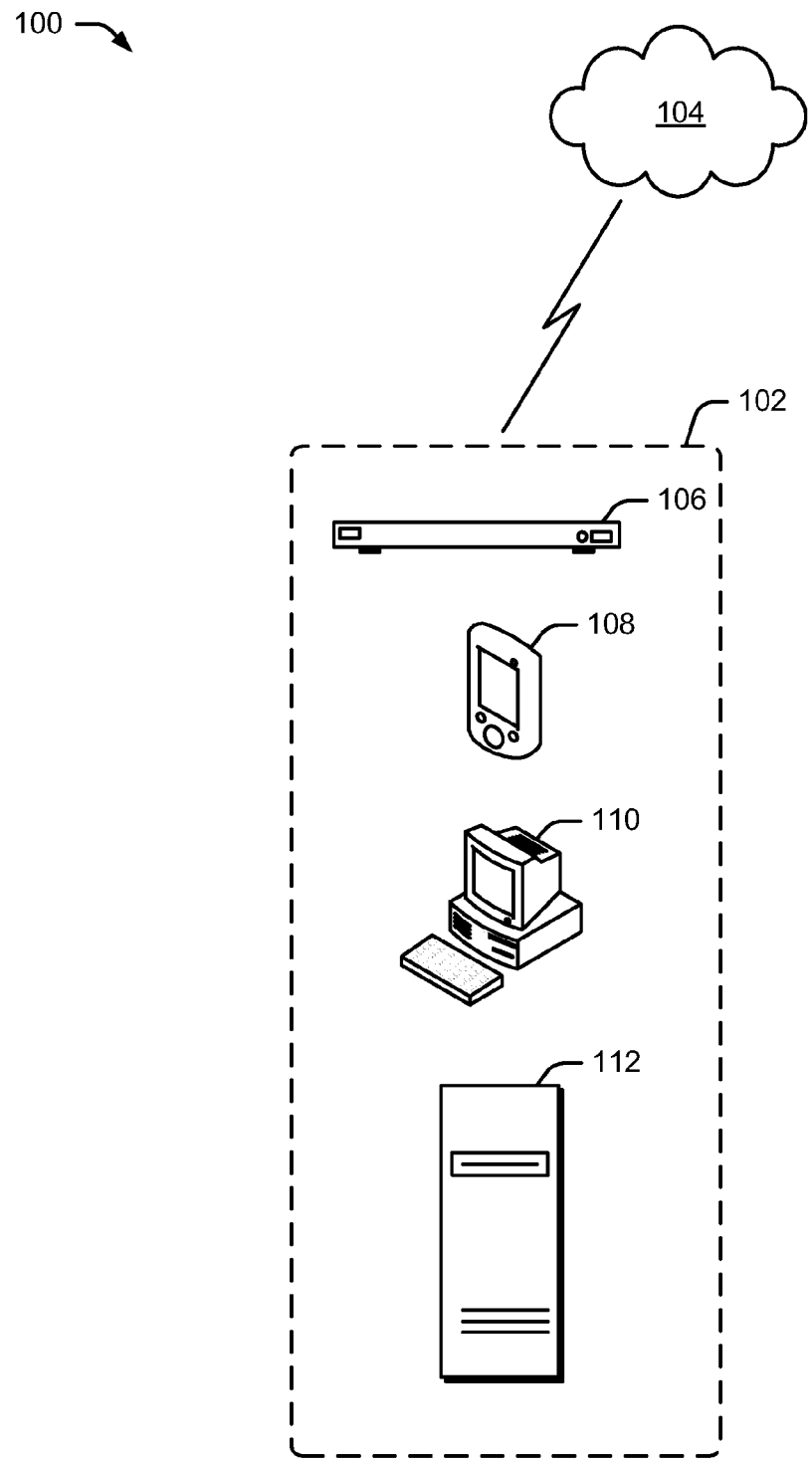
FIG. 1 illustrates an example environment in which these techniques may be performed.

FIG. 1 is an illustration of an example environment 100 having a computing device 102 and communication network 104, through which computing device 102 may communicate. Generally, computing device 102 encodes structured data to provide a sequence of data that may be transmitted through network 104 or saved to a storage medium (not shown). In some embodiments, computing device 102 structures a sequence of data received through communication network 104 or read from a storage medium (not shown) to provide structured data for processing.

Computing device 102 can be any device capable of communicating over a network (e.g., communication network 104), writing data to a storage medium, and/or reading from a storage medium or any combination thereof. Computing device 102 is illustrated, by way of example and not limitation, as one of a set top box 106, a smartphone 108, a desktop computer 110, or a server 112. Communication network 104 may include any suitable network such as the Internet, a local-area network, a wide-area network, a wireless-network, a personal-area network, a dial-up network, and/or a USB bus, to name a few.

Figure 2:
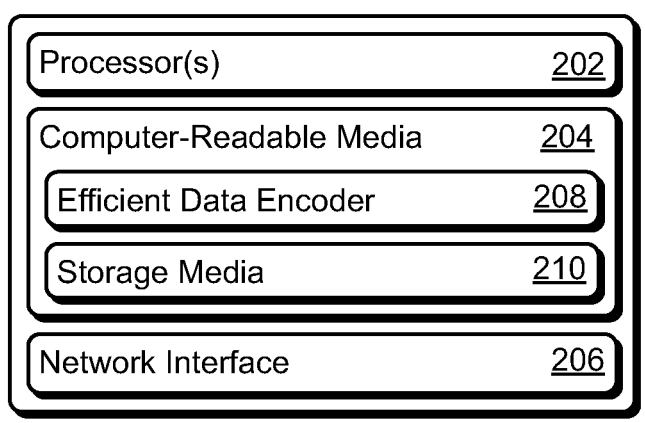
FIG. 2 illustrates an example computing device of FIG. 1 in more detail.

FIG. 2 illustrates an example computing device 102 of FIG. 1 in more detail. Computing device 102 includes processor(s) 202, computer-readable media (CRM) 204, and network interface 206. Computer-readable media 204 contains efficient data encoder 208 and storage media 210. Efficient data encoder 208 is described as part of the processes discussed below. Storage media 210 includes internal and/or external (but local) memory and is capable of storing data.

Generally, any of the techniques and abilities described herein can be implemented using software, firmware, hardware (e.g., fixed-logic circuitry), manual processing, or any suitable combination of these implementations. The example computing device 102 generally represents software, firmware, hardware or any combination thereof. In the case of a software implementation, for instance, efficient data encoder 208 represents computer-executable instructions (e.g., program code) that perform specific tasks when executed on a processor (e.g., CPU or CPUs). The program code can be stored in one or more computer-readable memory devices, such as computer readable media 204 and/or storage media 210. The features and techniques described herein are platform-independent, meaning that they may be implemented on a variety of commercial computing platforms having a variety of processors.

Example Processes

The following discussion describes techniques of efficiently sequencing data in a particular order to provide a sequence of data elements suitable for storage or communication. Generally, these techniques enable a computing device to efficiently store and/or communicate structured data. For example, computing device 102 sequences structured data elements providing a sequence of data elements having a particular order that may be transmitted through communication network 104 or written to storage media 210. In some embodiments, a sequence of data having a particular order may be structured, based on information about the particular order, to provide structured data elements suitable for processing. For example, computing device 102 may receive a sequence of data having a particular order through communication network 104. Computing device 102 may write the received sequence of data to storage media 210 or structure the received sequence of data and process the resulting structured data using processor(s) 202.

Aspects of these processes may be implemented in hardware, firmware, software, or a combination thereof. These processes are shown as sets of blocks that specify operations performed, such as through one or more entities or devices, and are not necessarily limited to the order shown for performing the operations by the respective blocks. In portions of the following discussion reference may be made to environment 100 of FIG. 1 as well as entities of environment 100 illustrated in FIG. 2.

Figure 3:
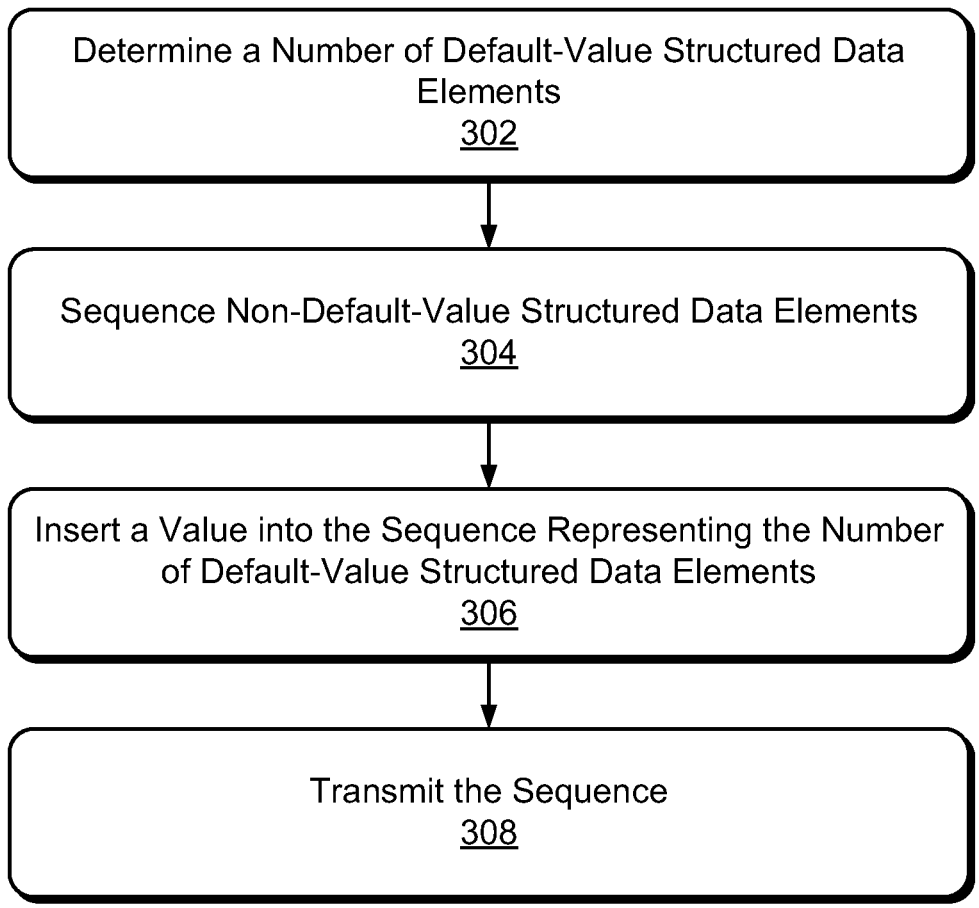
FIG. 3 is a flow diagram depicting an example process for transmitting structured data elements.

FIG. 3 is a flow diagram depicting an example process 300 for sequencing structured data elements. Block 302 determines a number of default-value structured data elements of a set of default and non-default-value structured data elements forming at least a portion of a data structure, the default-value structured data elements being consecutive data elements of a particular order. The number of default-value structured data elements may be determined relative to the default-value data elements proceeding or following non-default-value data elements of the particular order present in the set of structured data elements. It is to be appreciated, however, that the determined number of default-value structured data elements may be one or zero without altering or departing from the principles associated with the techniques described herein. The structured data elements may include any number of primitive datatypes or complex datatypes composed of other datatypes, primitive or otherwise. Examples of complex datatypes include DataContract annotated objects, objects implementing ICollection, objects implementing IDictionary, and arrays, to name a few.

The particular order of which the default-value structured data elements are consecutive data elements is pre-defined. In some cases the particular order can be defined implicitly or explicitly by a type of the structured data. For example, properties, field annotations, or other references associated with the structured data may define an ordering schema. In other cases, the particular order may be defined manually. For instance, by way of example and not limitation, a programmer may define or edit the particular order when creating, modifying, and/or updating a data structure encoding schema or protocol. Optionally, modifying the particular order by only adding fields to the end of the particular order maintains forwards and backwards compatibility between revisions of that particular order.

By way of example, consider process 300 in the context of environment 100. Efficient data encoder 208 determines, at block 302, a number of default-value structured data elements from a set of default and non-default-value structured data elements. Here assume that efficient data encoder 208 is configured to determine a number of default-value structured data elements that are consecutive data elements preceding non-default data elements of a particular order. In the context of the present example, assume that smartphone 108 is transmitting data, including a contact object, to a remote entity through communication network 104. Assume also that the contact object includes structured data elements relating to contact details for a name prefix, first, middle, and last name, name suffix, email address, work address, work telephone number, and cell-phone number, wherein the structured data elements relating to the name prefix, name suffix, and email address are default-valued.

Continuing the present example, efficient data encoder 208 determines a number of default-value structured data elements of the contact object that are consecutive data elements of a particular order preceding non-default-value data elements of the particular order present in the contact object. For this example, assume the particular order as the order listed above starting with name prefix and ending with cell-phone number. In this case, efficient data encoder 208 determines that there is one default-value structured data element, the default-value data element relating to the name prefix, preceding non-default-value data elements of the particular order, the non-default-value data elements relating to the first, middle, and last name of the contact.

Block 304 sequences, based on the particular order, non-default-value structured data elements. In some cases the non-default-value structured data elements are consecutive data elements of the particular order. Continuing the ongoing example, efficient data encoder 208 sequences, based on the particular order listed above, non-default-value data elements of the contact object. Assume here that efficient data encoder 208 is configured to sequence non-default-value structured data elements that are consecutive data elements of a particular order. Continuing the current example, the non-default-value structured data elements of the contact object relating to first, middle, and last name of the contact are sequenced by efficient data encoder 208.

Block 306 inserts a value into the sequence representing the number of default-value structured data elements. As discussed above, the number of default-value structured data elements may be determined relative to the default-value data elements proceeding or following non-default-value data elements of the particular order present in the set of structured data elements. In some cases, bits of the value representing the number of default-value structured data elements may be interleaved with bits of a value representing the number of non-default-value structured data elements sequenced providing a bit-interleaved value. Furthermore, in some cases, the bit-interleaved value may be encoded using 7-bit encoding thereby reducing the number of bytes occupied by the bit-interleaved value.

In the context of the present example, assume efficient data encoder 208 is configured to interleave bits of values representing a number of default-value structured data elements with bits of values representing a number of sequenced non-default-value structured data elements. Continuing the ongoing example, efficient data encoder 208 interleaves bits of a value representing the one default-value structured data element of the contact object with bits of a value representing the three sequenced non-default-value structured data elements of the contact object. Efficient data encoder 208 then inserts the bit-interleaved value into the sequence of contact data elements.

Optionally, operations of blocks 302, 304, and 306 may be repeated, determining additional numbers of default-value structured data elements of the set of default and non-default-value structured data elements, sequencing additional non-default-value structured data elements, and inserting additional values into the sequence representing the default-value structured data elements. In some cases a length value may be inserted into the sequence representing an overall byte length of the sequence delineating multiple sequences.

Continuing the ongoing example, efficient data encoder 208 determines an additional number of default-value structured data elements of the contact object that are consecutive data elements of the particular order preceding additional non-default-value data elements of the particular order present in the contact object. In this case, efficient data encoder 208 determines that there are two default-value structured data elements, the default-value data elements relating to the name suffix and email address, which are consecutive data elements preceding non-default-value data elements of the particular order. Efficient data encoder 208 then sequences the three non-default structured data elements, relating to the work address, work telephone number, and cell-phone number of the contact, and inserts another bit-interleaved value representing the two default-value structured data elements and the three sequenced data elements as discussed above.

Block 308 transmits the sequence to an entity, the entity having access to information about the particular order. In some cases, the sequence is transmitted via a network interface, although any suitable means may be used. Optionally, information about the particular order may comprise information about a portion of the particular order. The steps of example process 300 may be repeated to transmit additional structured data.

Continuing the ongoing example, smartphone 108 transmits the sequence of contact object data elements through communication network 104. In the present example the sequence comprises six data elements associated with the contact object and the two bit-interleaved values, each bit-interleaved value representing a number of default-value structured data elements and a number of sequenced non-default-value structured data elements. As will be discussed in more detail below, the contact object can later be structured from a sequence of data elements.

Figure 4:
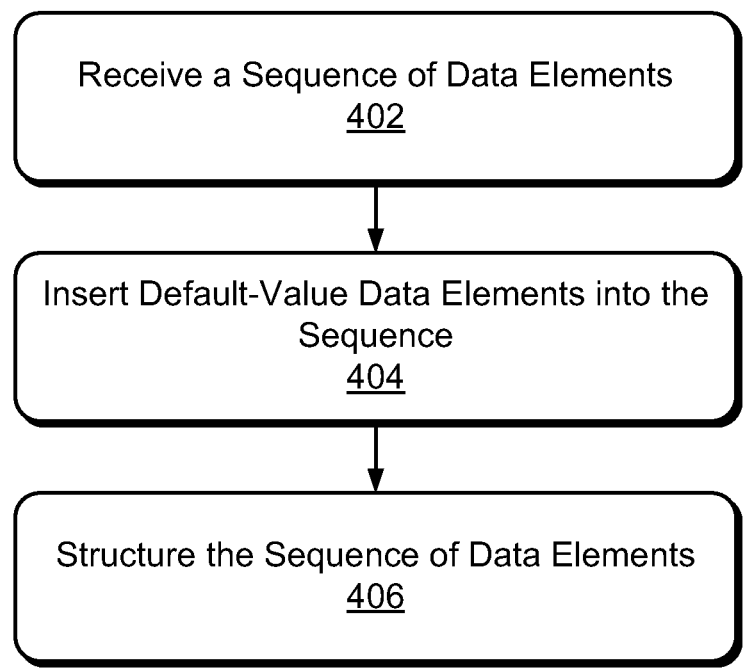
FIG. 4 is a flow diagram depicting an example process for receiving a sequence of data elements.

FIG. 4 is a flow diagram depicting an example process 400 for receiving a sequence of data elements. Block 402 receives a sequence of data elements having a particular order and a value, the value representing a number of consecutive default-value data elements. In some cases, a sequence may include additional values, representing additional numbers of consecutive default-value data elements. A value may be bit-interleaved enabling the value to represent a number of consecutive default-value data elements and a number of consecutive non-default-value data elements. In other cases, a value may be encoded reducing the number of bytes the value occupies in the sequence. Optionally, the sequence may contain a length value representing a byte length of the sequence. In some cases the sequence is received from a network interface. Other processes are also contemplated including reading a sequence of data elements from a storage medium.

By way of example, consider process 400 in the context of the above-mentioned example. Here smartphone 108 receives a sequence of data elements through data network 104. The received sequence of data elements is a sequence of data elements associated with the contact object in the example above. The sequence includes six non-default-value data elements of the contact object and two bit-interleaved values, each bit-interleaved value representing a number of default-value data elements and a number of non-default-value data elements of the contact object.

Block 404 inserts default-value data elements into the sequence based on the value and information about the particular order. In some instances, the information about the particular order may include information about only a portion of the particular order. In some cases, a bit-interleaved value may be separated to provide a value to represent a number of consecutive default-value data elements and a number of consecutive non-default-value data elements. Furthermore, an encoded value may be un-encoded to expose the value for use at block 404. The number of default-value data elements to insert and their respective positions within the sequence may be determined from any suitable information available, such as field identifiers, values within the sequence, non-default-value data elements present in the sequence, and/or the particular order of the sequence or any combination thereof. Optionally, operations of block 404 may be repeated, inserting additional numbers of consecutive default-value data elements into the sequence.

Continuing the ongoing example, efficient data encoder 208 inserts default-value data elements into the received sequence utilizing the two bit-interleaved values and information about the particular order of the sequence. Assume here efficient data encoder 208 is configured to separate a bit-interleaved value to provide a value representing a number of consecutive default-value data elements and a number of consecutive non-default-value data elements. Separating the first bit-interleaved value provides a value representing one default-value data element and a value representing three non-default-value data elements. Utilizing the separated values and information about the particular order, efficient data encoder 208 inserts a default-value data element relating to the name prefix of the contact object. In the context of the present example, repeating operations of block 404 with the second bit-interleaved value results in efficient data encoder 208 inserting default-value data elements relating to the name suffix and email address of the contact object completing the received sequence.

Block 406 structures the sequence of data elements based on the particular order to provide structured data suitable for processing. In some cases, only a portion of the sequence may be structured. For instance, only a portion of the sequence may be structured when information about the particular order is limited to that portion of the sequence. Continuing the present example, efficient data encoder 208 structures the sequence of data elements resulting from operations of block 404 based on information about the particular order used. The sequence of six received data elements and three inserted default-value elements is structured to provide a contact object suitable for use by smartphone 108.

Figure 5:
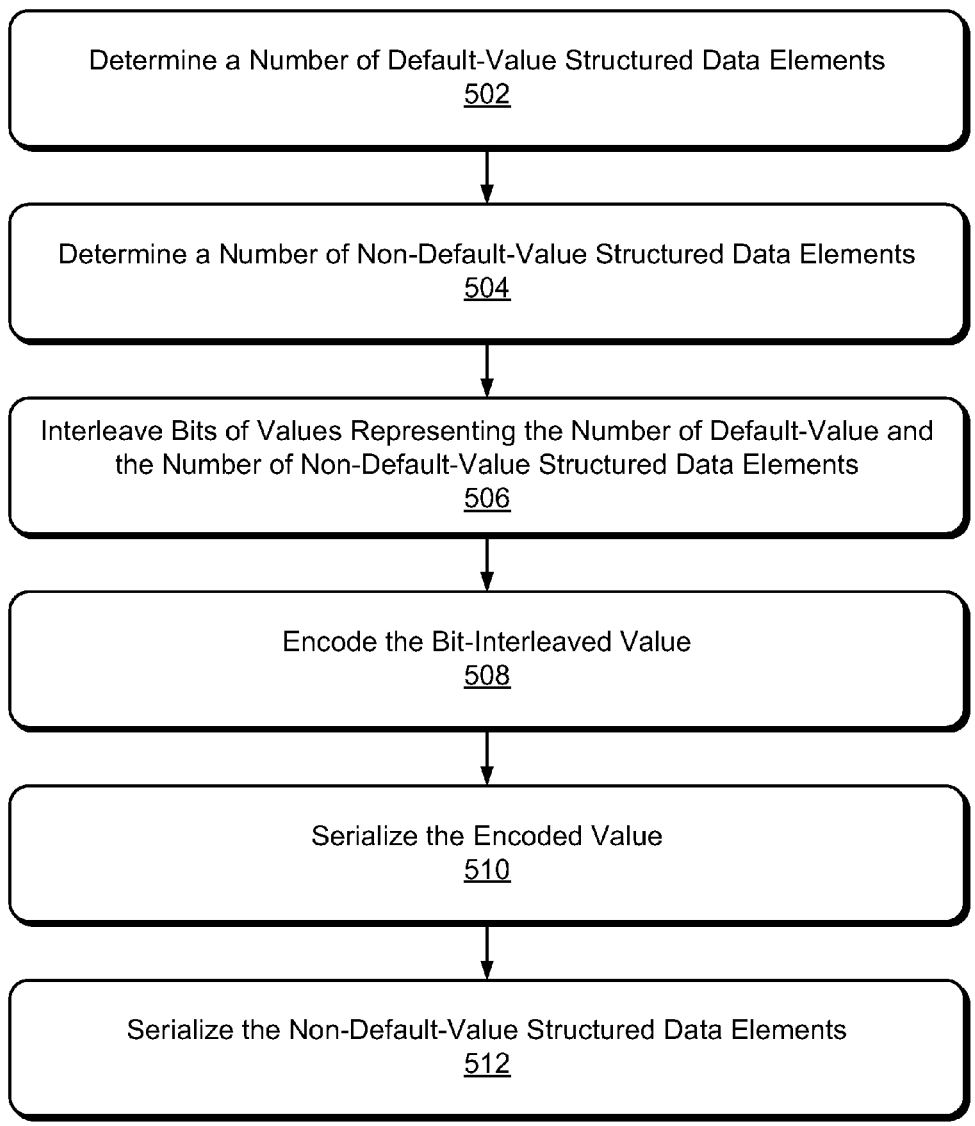
FIG. 5 is a flow diagram depicting an example process for serializing structured data elements.

FIG. 5 is a flow diagram depicting an example process 500 for serializing structured data elements. Block 502 determines a number of default-value structured data elements, the default-value data elements being consecutive data elements of a particular order. The number of default-value structured data elements may be determined relative to the default-value data elements proceeding or following non-default-value data elements of the particular order.

Consider process 500 in the context of the prior mentioned examples. Here efficient data encoder 208 determines a number of default-value structured data elements preceding non-default-value data elements of the particular order present in the contact object. As in the example above, assume the particular order for the nine data elements as presented above starting with a name prefix and ending with a cell-phone number, wherein the structured data elements relating to the name prefix, name suffix, and email address are default-valued. Efficient data encoder 208 determines that there is one default-value structured data element relating to the name prefix and preceding non-default-value data elements of the particular order.

Block 504 determines a number of non-default-value structured data elements, the non-default-value data elements being consecutive data elements of the particular order. In the context of the present example, efficient data encoder 208 determines there are three non-default-value structured data elements, relating to the first, middle, and last name, subsequently consecutive to the default-value data element of the particular order.

Block 506 interleaves bits of a value representing the number of default-value structured data elements and bits of a value representing the number of non-default-value structured data elements to provide a bit-interleaved value. Combining the values representing the number of default and non-default data elements (xxxx xxxx, yyyy yyyy), block 506 interleaves bits of each value to produce a single bit-interleaved value (yxyx yxyx yxyx yxyx). As the values representing the number of default and non-default data elements tend to be small and similar, bit-interleaving the values often allows a number of bytes required to represent the values to be reduced. Continuing the ongoing example, efficient data encoder 208 interleaves the bits of the values representing the default-value and non-default-value data elements (1, 3), represented in binary as ($0000\ 0001_2$, $0000\ 0011_2$), to produce a bit-interleaved value ($0000\ 0000\ 0000\ 1011_2$), represented as 0x000b in hexadecimal format.

Block 508 encodes, using 7-bit encoding, the bit-interleaved value. By encoding smaller values with fewer bytes, encoding overhead can be reduced. In the context of the present example, efficient data encoder 208 7-bit encodes the bit-interleaved value 0x000b as 0x0b to reduce the bytes required to represent the default-value and non-default-value data elements by half.

Block 510 serializes the 7-bit encoded value. In some cases, the 7-bit encoded value may be serialized prior to serializing non-default-value structured data elements represented by the 7-bit encoded value. Block 510 may serialize the 7-bit encoded value ahead of a set of serialized data elements or insert the 7-bit encoded value into an existing set of serialized data elements. Continuing the ongoing example, the 7-bit encoded value 0x0b is serialized by efficient data encoder 208 prior to serializing the non-default-value data elements represented by the 7-bit encoded value.

Block 512 serializes, based on the particular order, the non-default-value structured data elements represented by the 7-bit encoded value. Continuing the ongoing example, efficient data encoder 208 serializes the three non-default-value structured data elements of the contact object relating to the first, middle, and last name. Optionally, the serialized data elements can be encoded using any suitable techniques such as 7-bit encoding, Zig-Zag encoding, and/or Morton encoding to name a few. Depending on the transport medium, a master byte length may also be encoded within data elements of varying size. In some cases, serialized data elements having a default value of zero are decremented to reduce a probability that an extra byte will be necessary when 7-bit encoding the serialized data element. Optionally, blocks of process 500 may be repeated to serialize remaining structured data elements and/or additional data structures.

In some cases the encoded serialized data elements are transmitted through a network interface, such as a local area network, a wireless local area network, or a cellular network. In other cases the encoded serialized data elements may be written to storage, such as storage media 210.

Repeating operations of process 500 for the remaining structured data elements, efficient data encoder 208 serializes an additional 7-bit encoded value 0x0d representing the two default-value structured data elements of the contact object relating to a name suffix and email address and the remaining non-default-value data elements. Concluding the present example, efficient data encoder 208 serializes the remaining non-default data elements of the contact object relating to a work address, work telephone number, and cell-phone number. Here the encoded serialized data elements may be transmitted through communication network 104 or written to storage media 210 by smartphone 108.

Figure 6:
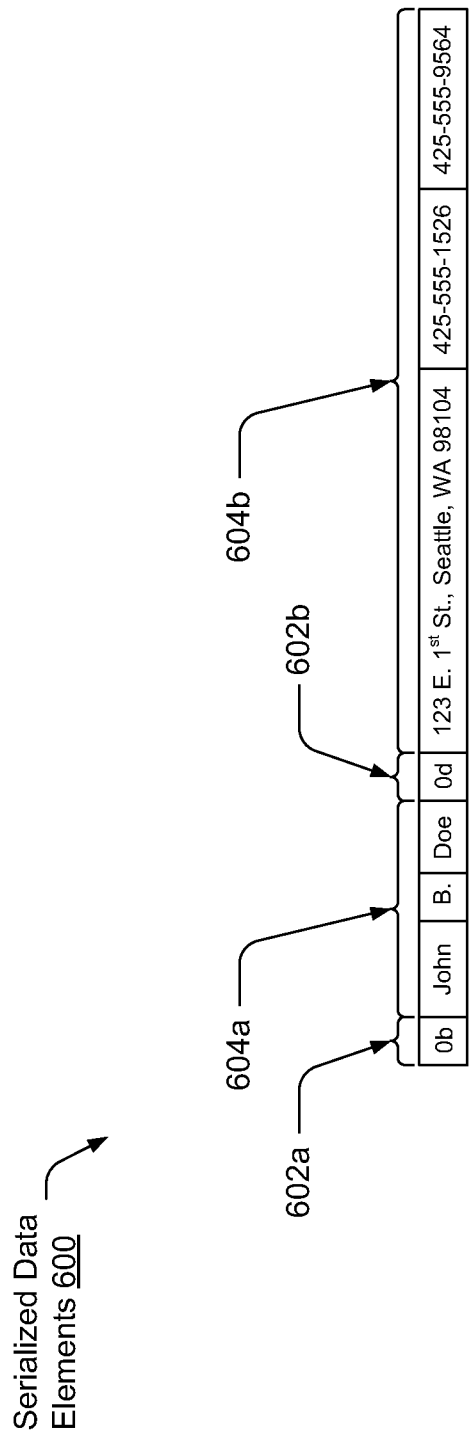
FIG. 6 illustrates an example of serialized data elements in accordance with one or more embodiments.

FIG. 6 illustrates example serialized data elements 600 in the context of example process 500 as discussed above. In the illustrated example, serialized data elements 600 contain 7-bit encoded values 602*a* and 602*b*, each representing a number of default and non-default-value data elements within the sequence. Serialized data elements 606*a* and 606*b* have non-default values (here containing data relating to the contact object). Prior to storage or communication, data elements 606*a* and 606*b* may be encoded into binary format by encoding the numeric data as discussed above and transforming the strings into UTF8 format to be encoded as byte arrays.

Conclusion

This document describes various techniques for efficiently sequencing structured data in a particular order to provide a sequence of data elements suitable for storage or communication. The sequence may contain values representing a number of default-value structured data elements omitted from the sequence and/or a length value representing a byte length of the sequence. Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A device-implemented method comprising:
   determining, via a data encoder of a device, a number of consecutive non-default-value structured data elements of a set of default-value structured data and non-default-value structured data elements forming at least a portion of a data structure and having a particular order;
   determining a number of consecutive default-value structured data elements of the particular order that precede or follow consecutive non-default-value structured data elements in the particular order;
   sequencing, based on the particular order, the consecutive non-default-value structured data elements;
   inserting, into the sequence and adjacent to the consecutive non-default-value structured data element that the consecutive default-value data elements precede or follow, a value representing the number of consecutive non-default-value structured data elements and the number of consecutive default-value structured data elements that precede or follow the consecutive non-default-value structured data elements, the consecutive default-value structured data elements not inserted into the sequence; and
   transmitting, via a data interface of the device, the sequence to an entity, the entity having access to information about the particular order, the sequence not including the consecutive default-value structured data elements.

2. The device-implemented method as recited in claim 1, wherein the information about the particular order includes information about only a portion of the particular order.

3. The device-implemented method as recited in claim 1, wherein the act of inserting the value inserts a bit-interleaved value, the bit interleaved value an interleaving of bits of the value representing the number of consecutive default-value structured data elements and the value representing the number of sequenced consecutive non-default-value structured data elements.

4. The device-implemented method as recited in claim 3, further comprising interleaving bits of the value representing the number of consecutive default-value structured data elements and bits of the value representing the number of sequenced consecutive non-default-value structured data elements to provide the bit interleaved value.

5. The device-implemented method as recited in claim 1, further comprising inserting a length value into the sequence, the length value representing a byte length of the sequence transmitted to the entity.

6. The method as recited in claim 1, wherein the data interface of the device is a network interface or an interface to a storage device.

7. A device-implemented method comprising:
receiving, via a data interface of a device, a sequence of data elements having a particular order and a value, the data elements being non-default-value data elements of the particular order, the value representing a number of consecutive default-value data elements and a number of consecutive non-default-value data elements, the value indicating the number of consecutive default-value data elements that precede or follow the consecutive non-default-value data element in the particular order, the default-value data elements not received with the sequence;
inserting, via a data encoder of the device, default-value data elements into the sequence based on the value representing the number of consecutive default-value data elements and the number of consecutive non-default-value data elements and information about the particular order, the default-value data elements inserted adjacent to the consecutive non-default-value data elements that the consecutive default-value data elements precede or follow; and
structuring the sequence of the consecutive non-default-value data elements and consecutive default-value data elements to provide structured data.

8. The device-implemented method as recited in claim 7, wherein the sequence of data elements does not include any default-value data elements and the value is located between the consecutive non-default-value data elements and another set of consecutive non-default-value data elements of the sequence of data elements.

9. The device-implemented method as recited in claim 7, further comprising structuring only a portion of the sequence of data elements to provide structured data.

10. The device-implemented method as recited in claim 7, wherein the sequence further comprises a length value representing a byte length of the sequence.

11. The device-implemented method as recited in claim 7, wherein the value is Morton encoded, the Morton-encoded value representing the number of consecutive default-value data elements and the number of consecutive non-default-value data elements.

12. The device-implemented method as recited in claim 7, wherein the data interface is a network interface or an interface to a storage device.

13. A device-implemented method comprising:
determining a number of non-default-value structured data elements of a data structure, the non-default-value data elements being consecutive data elements of a particular order;
determining a number of consecutive default-value structured data elements of the data structure, the consecutive default-value data elements preceding or following the consecutive non-default-value structured data elements in the particular order;
interleaving bits of a bit-value representing the number of consecutive non-default-value structured data elements and bits of a bit-value representing the number of consecutive default-value structured data elements to provide a bit interleaved value representing the number of consecutive non-default-value structured data elements and the number of consecutive default-value structured data elements;
encoding, using 7-bit encoding, the bit-interleaved value to provide a 7-bit encoded value representing the number of consecutive non-default-value structured data elements and the number of consecutive default-value structured data elements;
serializing the 7-bit encoded value; and
serializing, based on the particular order, the non-default-value structured data elements to respectively precede or follow the 7-bit encoded value representing the number of consecutive non-default-value structured data elements and the number of consecutive default-value structured data elements, the default-value structured data elements not serialized into the serialized data elements.

14. The device-implemented method as recited in claim 13, further comprising inserting, into the serialized data elements, a length value representing a byte length of the serialized data elements.

15. The device-implemented method as recited in claim 13, further comprising transmitting the serialized data elements through a network interface.

16. The device-implemented method as recited in claim 13, further comprising storing the serialized data elements on a computer-readable storage medium.

17. The device-implemented method as recited in claim 13, further comprising encoding the serialized data elements.

18. The device-implemented method as recited in claim 17, further comprising decrementing serialized data elements having a default value of zero.

19. The device-implemented method as recited in claim 17, further comprising encoding, using Zig-Zag encoding, serialized data elements that include signed integers.

20. The device-implemented method as recited in claim 17, further comprising encoding, using 7-bit encoding, serialized data elements that include unsigned integers.

\* \* \* \* \*